(12) United States Patent
Ryu et al.

(10) Patent No.: US 12,228,599 B2
(45) Date of Patent: Feb. 18, 2025

(54) APPARATUS FOR INSPECTING ANTENNA AND METHOD FOR INSPECTING ANTENNA

(71) Applicant: DONGWOO FINE-CHEM CO., LTD., Jeollabuk-do (KR)

(72) Inventors: Han Sub Ryu, Gyeongsangbuk-do (KR); Dong Pil Park, Incheon (KR); Byung Jin Choi, Incheon (KR)

(73) Assignee: DONGWOO FINE-CHEM CO., LTD., Jeollabuk-Do (KR)

( * ) Notice: Subject to any disclaimer, the term of this patent is extended or adjusted under 35 U.S.C. 154(b) by 82 days.

(21) Appl. No.: 17/986,075

(22) Filed: Nov. 14, 2022

(65) Prior Publication Data
US 2023/0070750 A1    Mar. 9, 2023

Related U.S. Application Data

(63) Continuation of application No. PCT/KR2021/005812, filed on May 10, 2021.

(30) Foreign Application Priority Data

May 13, 2020 (KR) .................. 10-2020-0056944

(51) Int. Cl.
*G01R 29/08* (2006.01)
*G01R 29/10* (2006.01)

(52) U.S. Cl.
CPC ......... *G01R 29/0878* (2013.01); *G01R 29/10* (2013.01)

(58) Field of Classification Search
CPC .......................... G01R 29/0878; G01R 29/10; G01R 29/0871; G01R 31/01; G01R 31/2812; G01R 31/2822; H01Q 9/0407
See application file for complete search history.

(56) References Cited

U.S. PATENT DOCUMENTS

| | | | | |
|---|---|---|---|---|
| 9,817,025 | B2* | 11/2017 | Isaac | G01R 31/2889 |
| 10,823,776 | B2* | 11/2020 | Fang | G01R 29/10 |
| 11,579,178 | B1* | 2/2023 | Lee | G01R 29/0871 |
| 2012/0268153 | A1* | 10/2012 | Nickel | G01R 31/3025 |
| | | | | 324/754.31 |
| 2018/0067156 | A1 | 3/2018 | Watkins et al. | |

FOREIGN PATENT DOCUMENTS

| | | |
|---|---|---|
| CN | 101454680 A | 6/2009 |
| CN | 103412196 A | 11/2013 |
| CN | 209858647 U | 12/2019 |

(Continued)

OTHER PUBLICATIONS

International Search Report for PCT/KR2021/005812 mailed on Aug. 27, 2021.

(Continued)

*Primary Examiner* — Seung H Lee
(74) *Attorney, Agent, or Firm* — The PL Law Group, PLLC (57) ABSTRACT

An apparatus for inspecting an antenna includes a stage including a ground on which an antenna device is disposed, an inspection board configured to be in contact with and connected to the antenna device, a connection maintaining unit for maintaining a contact and connection between the antenna device and the inspection board, and an inspection unit mounted or connected to the inspection board to inspect the antenna device.

13 Claims, 9 Drawing Sheets

(56) References Cited

FOREIGN PATENT DOCUMENTS

| | | |
|---|---|---|
| CN | 215375602 U | 12/2021 |
| JP | H08-21862 A | 1/1996 |
| JP | 2003-084021 A | 3/2003 |
| JP | 2004-279110 A | 10/2004 |
| JP | 2020-038184 A | 3/2020 |
| KR | 10-1132615 B1 | 4/2012 |
| KR | 10-2015-0069809 A | 6/2015 |
| KR | 10-2019-0005410 A | 1/2019 |

OTHER PUBLICATIONS

Office action issued on Nov. 27, 2024 from Korean Patent Office in a counterpart Korean Patent Application No. 10-2020-0056944 (all the cited references are listed in this IDS.) (English translation is also submitted herewith.).

Office action issued on Dec. 6, 2024 from China Patent Office in a counterpart China Patent Application No. 202110522814.1 (English translation is also submitted herewith.).

\* cited by examiner

APPARATUS FOR INSPECTING ANTENNA AND METHOD FOR INSPECTING ANTENNA

CROSS-REFERENCE TO RELATED APPLICATION AND CLAIM OF PRIORITY

The present application is a continuation application to International Application No. PCT/KR2021/005812 with an International Filing Date of May 10, 2021, which claims the benefit of Korean Patent Application No. 10-2020-0056944 filed on May 13, 2020 at the Korean Intellectual Property Office, the disclosures of which are incorporated by reference herein in their entirety.

BACKGROUND

1. Technical Field

The present invention relates to an apparatus for inspecting an antenna and a method for inspecting an antenna.

2. Background Art

As information technologies have been developed, a wireless communication technology such as Wi-Fi, Bluetooth, etc., is combined with a display device in, e.g., a smartphone form. In this case, an antenna may be combined with the display device to provide a communication function.

As mobile communication technologies have been rapidly developed, an antenna capable of operating a high frequency or ultra-high frequency communication is needed in the display device. Further, as thin, high-transparency and high-resolution display devices such as a transparent display and a flexible display are recently developed, the antenna is also developed to have improved transparency, flexibility, etc.

To actually apply the to a product, performance and defects of the antenna may be inspected. Thus, technologies for a simple and effective inspection of the performance and defects of the antenna are required.

SUMMARY

According to an aspect of the present invention, there is provided an apparatus for inspecting an antenna and a method for inspecting an antenna which employ non-optical method.

(1) An apparatus for inspecting an antenna, including: a stage on which an antenna device is disposed, the stage including a ground; an inspection board configured to be in contact with and connected to the antenna device; a connection maintaining unit for maintaining a contact and connection between the antenna device and the inspection board; and an inspection unit mounted or connected to the inspection board to inspect the antenna device.

(2) The apparatus for inspecting an antenna of the above (1), wherein the ground is formed of a metal having a resistance value of 3 S2 or less.

(3) The apparatus for inspecting an antenna of the above (2), wherein the ground is formed of silver, gold, copper, aluminum or an alloy containing at least one therefrom.

(4) The apparatus for inspecting an antenna of the above (1), wherein the inspection board includes a flexible printed circuit board.

(5) The apparatus for inspecting an antenna of the above (1), wherein the connection maintaining unit is configured to press a contact portion between the antenna device and the inspection board to maintain the contact and connection between the antenna device and the inspection board.

(6) The apparatus for inspecting an antenna of the above (1), wherein the inspection unit is configured to measures an S parameter and a radiation efficiency of the antenna device.

(7) The apparatus for inspecting an antenna of the above (1), further including a first adjustment unit for determining an alignment state between the antenna device and the ground.

(8) The apparatus for inspecting an antenna of the above (7), wherein the first adjustment unit adjusts a position of the antenna device or the ground based on the determined alignment state (9) The apparatus for inspecting an antenna of the above (1), further including a second adjustment unit for determining an alignment state or a contact state of the inspection board and the antenna device.

(10) The apparatus for inspecting an antenna of the above (9), wherein the second adjustment unit adjusts a position of the inspection board or the antenna device based on the determined alignment state or the contact state.

(11) The apparatus for inspecting an antenna of the above (1), wherein the stage further includes a board supporting portion, and the board supporting portion is configured to support the antenna device or the inspection board, (12) The apparatus for inspecting an antenna of the above (11), wherein the board supporting portion is formed of Teflon or isopink.

(13) A method for inspecting an antenna, including: placing an antenna device on a stage including a ground; contacting and connecting an inspection board with the antenna device; pressing a contact portion between the inspection board and the antenna device; and inspecting the antenna device.

(14) The method of the above (13), further including: determining an alignment state between the antenna device and the ground; and adjusting a position of the antenna device or the ground based on the determined alignment state (15) The method of the above (13), further including: determining an alignment state or a contact state between the inspection board and the antenna device; and adjusting a position of the inspection board or the antenna device based on the determined alignment state or the contact state.

According to exemplary embodiments of the present invention, an S-parameter and a radiation efficiency of an antenna may be inspected by a non-optical method, and a bonding defect or a pattern loss of the antenna may also be detected.

Additionally, automation of the antenna inspection may be implemented to perform the antenna inspection in a short time.

DETAILED DESCRIPTION OF THE EMBODIMENTS

Hereinafter, the present invention will be described in detail with reference to the accompanying drawings. However, those skilled in the art will appreciate that such embodiments described with reference to the accompanying drawings are provided to further understand the spirit of the present invention and do not limit subject matters to be protected as disclosed in the detailed description and appended claims.

Reference numeral indicating process steps include in the accompanying drawings are used for convenience of easily specifying the process steps, and are not intended to limit an sequential order of the process steps.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The terms "one", "the other", "upper", "lower", etc., are relatively used based on an orientation of the drawings, and are not intended to designate absolute positions.

Figure 1:
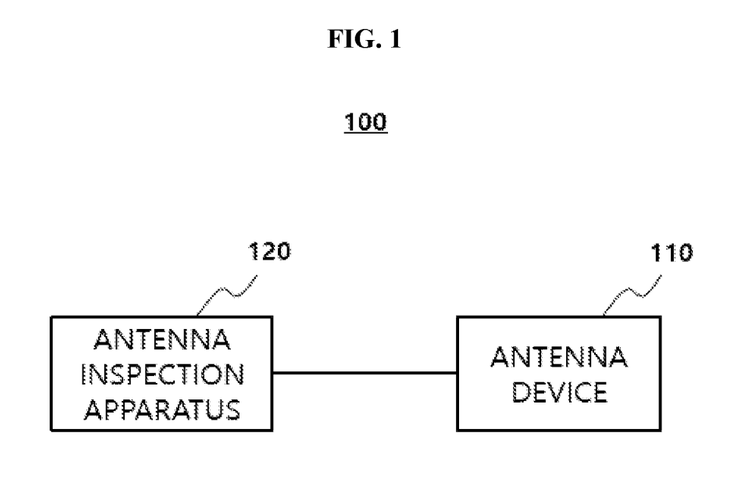
FIG. 1 is a schematic block diagram illustrating a system for inspecting an antenna in accordance with exemplary embodiments.

FIG. 1 is a schematic block diagram illustrating a system for inspecting an antenna in accordance with exemplary embodiments.

Referring to FIG. 1, a system for inspecting an antenna 100 may include an antenna device 110 and an apparatus for inspecting an antenna (also referred to as an antenna inspection apparatus) 120.

The antenna device 110 may be, e.g., a microstrip patch antenna fabricated in the form of a transparent film. The antenna device 110 may be applied to communication devices for a mobile communication of a high or ultrahigh frequency band corresponding to a mobile communication of, e.g., 3G, 4G, 5G or more.

The antenna device 110 may be applied to an image display device. The image display device may be implemented in the form of various electronic devices such as a smart phone, a tablet, a laptop computer, a wearable device, a digital camera, etc.

However, an application of the antenna device 110 is not limited to the image display device, and may be applied to various objects or structures such as a vehicle, a home electronic appliance, an architecture, etc.

For example, the antenna inspection apparatus 120 may measure an S parameter and a radiation efficiency of the antenna device 110, and may inspect whether a bonding defect or an antenna pattern loss occurs using a non-optical method.

Detailed description of the antenna inspection apparatus 120 will be provided with reference to FIGS. 2 to 6.

Figure 2:
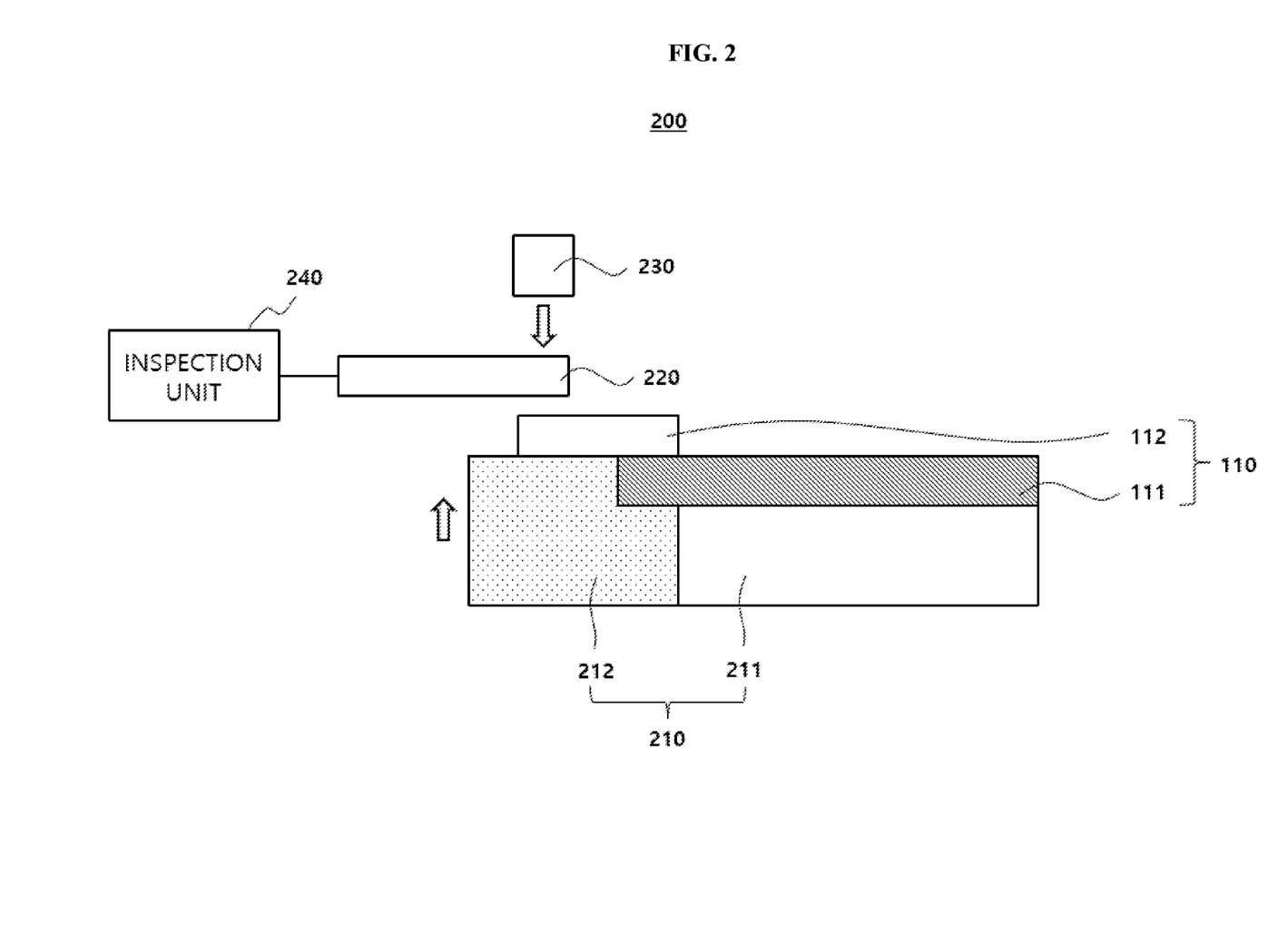
FIG. 2 schematically illustrates an apparatus for inspecting an antenna in accordance with an exemplary embodiment.

FIG. 2 schematically illustrates an apparatus for inspecting an antenna in accordance with an exemplary embodiment.

Referring to FIG. 2, an antenna inspection apparatus 200 may include a stage 210, an inspection board 220, a connection maintaining unit 230 and an inspection unit 240.

The antenna device 110 to be inspected may be disposed on the stage 210.

The antenna device 110 to be inspected may include an antenna element 111 and an antenna board 112. The antenna element 111 may include a dielectric layer and an antenna conductive layer.

The dielectric layer may include an insulating material having a predetermined dielectric constant. In an embodiment, the dielectric layer may include an inorganic insulating material such as glass, silicon oxide, silicon nitride, a metal oxide, etc., or an organic insulating material such as an epoxy resin, an acrylic resin, an imide-based resin, etc. The dielectric layer may serve as a film substrate of the antenna element on which the antenna conductive layer is formed.

In an embodiment, the dielectric layer may include, e.g., a transparent resin material. For example, the dielectric layer may include a polyester-based resin such as polyethylene terephthalate, polyethylene isophthalate, polyethylene naphthalate and polybutylene terephthalate; a cellulose-based resin such as diacetyl cellulose and triacetyl cellulose; a polycarbonate-based resin; an acrylic resin such as polymethyl (meth)acrylate and polyethyl (meth)acrylate; a styrene-based resin such as polystyrene and an acrylonitrile-styrene copolymer; a polyolefin-based resin such as polyethylene, polypropylene, a cycloolefin or polyolefin having a norbomene structure and an ethylene-propylene copolymer; a vinyl chloride-based resin; an amide-based resin such as nylon and an aromatic polyamide; an imide-based resin; a polyethersulfone-based resin; a sulfone-based resin; a polyether ether ketone-based resin; a polyphenylene sulfide resin; a vinyl alcohol-based resin; a vinylidene chloride-based resin; a vinyl butyral-based resin; an allylate-based resin; a polyoxymethylene-based resin; an epoxy-based resin; a urethane or acrylic urethane-based resin; a silicone-based resin, etc. These may be used alone or in a combination of two or more thereof.

In an embodiment, the dielectric layer may include an adhesive material such as an optically clear adhesive (OCA), an optically clear resin (OCR), or the like.

In an embodiment, the dielectric layer may be provided as a substantially single layer. In an embodiment, the dielectric layer 105 may include a multi-layered structure of at least two layers.

Capacitance or inductance may be formed in the dielectric layer, so that a frequency band at which the antenna element 111 may be driven or operated may be adjusted. If the dielectric constant exceeds about 12, a driving frequency may be excessively decreased, and driving in a desired high frequency or ultrahigh frequency band may not be implemented. Thus, according to an embodiment, the dielectric constant of the dielectric layer may be adjusted in a range from about 1.5 to about 12, preferably from 2 to 12.

The antenna conductive layer may be disposed on a top surface of the dielectric layer. The antenna conductive layer may include at least one antenna unit including a radiator and a transmission line.

The antenna unit may include silver (Ag), gold (Au), copper (Cu), aluminum (Al), platinum (Pt), palladium (Pd), chromium (Cr), titanium (Ti), tungsten (W), niobium (Nb), tantalum (Ta), vanadium (V), iron (Fe), manganese (Mn), cobalt (Co), nickel (Ni), zinc (Zn), tin (Sn), molybdenum (Mo), calcium (Ca) or an alloy containing at least one of the metals. These may be used alone or in a combination of at least two therefrom.

In an embodiment, the antenna unit may include silver (Ag) or a silver alloy (e.g., silver-palladium-copper (APC)), or copper (Cu) or a copper alloy (e.g., a copper-calcium (CuCa)) to implement a low resistance and a fine line width pattern.

In an embodiment, the antenna unit may include a transparent conductive oxide such as indium tin oxide (ITO), indium zinc oxide (IZO), indium zinc tin oxide (ITZO), zinc oxide (ZnOx), etc.

In an embodiment, the antenna unit may include a stacked structure of a transparent conductive oxide layer and a metal layer. For example, the antenna unit may include a double-layered structure of a transparent conductive oxide layer-metal layer, or a triple-layered structure of a transparent conductive oxide layer-metal layer-transparent conductive oxide layer. In this case, flexible property may be improved by the metal layer, and a signal transmission speed may also be improved by a low resistance of the metal layer. Corrosive resistance and transparency may be improved by the transparent conductive oxide layer.

The antenna board 112 may be electrically connected to the antenna element 111. For example, the antenna board 112 may be bonded to a top surface of the antenna element 111, and a transmission line of the antenna board 112 may be electrically connected to the antenna unit of the antenna element 111.

For example, the antenna board 112 may be bonded using an anisotropic conductive film (ACF) to enable an electrical conduction in a vertical direction and to be insulated in a horizontal direction. The antenna board 112 may also be electrically connected to the antenna element 111 using a coaxial cable.

In an embodiment, the antenna board 112 may include a flexible printed circuit board (FPCB).

The stage 210 may include a ground 211 and a board supporting portion 212.

A portion of the antenna element 111 may be disposed on the ground 211, and a remaining portion of the antenna element 111 and the antenna board 112 may be disposed on the board supporting portion 212. The board supporting portion 212 may support the antenna board 220.

As illustrated in FIG. 2, a stepped portion may be formed at an upper portion of the board supporting portion 212 such that a bonding portion of the antenna element 111 to which the antenna board 112 is bonded and the antenna board 112 may be disposed.

In an embodiment, the ground 211 may be formed of a metal having a low resistance. In this case, the low resistance may be 3Ω or less, preferably 1Ω or less. For example, the ground 211 may be formed of silver (Ag), gold (Au), copper (Cu), aluminum (Al), or an alloy containing at least one of the metals (e.g., a silver-palladium-copper (APC) alloy).

In an embodiment, the board supporting portion 212 may be formed of a material having a low dielectric constant, preferably a material having a dielectric constant of less than 5 (e.g., fluororesin (PTFE), foamed polystyrene, Teflon, isopink, etc.).

The inspection board 220 may contact the antenna board 112 to be connected to the antenna board 112. For example, the inspection board 220 may be in contact with a top surface of the antenna board 112, and a transmission line of the inspection board 220 may be electrically connected to a transmission line of the antenna board 112.

In an embodiment, the inspection board 220 may include a flexible printed circuit board (FPCB).

The connection maintaining unit 230 may maintain a contact and a connection between the antenna board 112 and the inspection board 220. For example, in a state in which the stage 210 is fixed, the connection maintaining unit 230 may descend from an upper region of the inspection board 220 according to a predetermined control signal, so that a contact region between the inspection board 220 and the antenna board 112 may be pressed with a predetermined pressure to maintain contact and connection between the inspection board 220 and the antenna board 112.

Alternatively, the stage 210 may be ascended while the connection maintaining unit 230 is fixed. Accordingly, the connection maintaining unit 230 may press the contact portion between the inspection board 220 and the antenna board 122 with a predetermined pressure to maintain the contact and connection between the inspection board 220 and the antenna board 112.

As described above, the contact and connection between the inspection board 230 and the antenna board 112 may be stably maintained.

The inspection unit 240 may be mounted or connected to the inspection board 220 to inspect the antenna element 111. For example, the inspection unit 240 may measure an S parameter and a radiation efficiency of the antenna, and may inspect whether bonding defects or an antenna pattern loss occurs based on the measured values.

Figure 3:
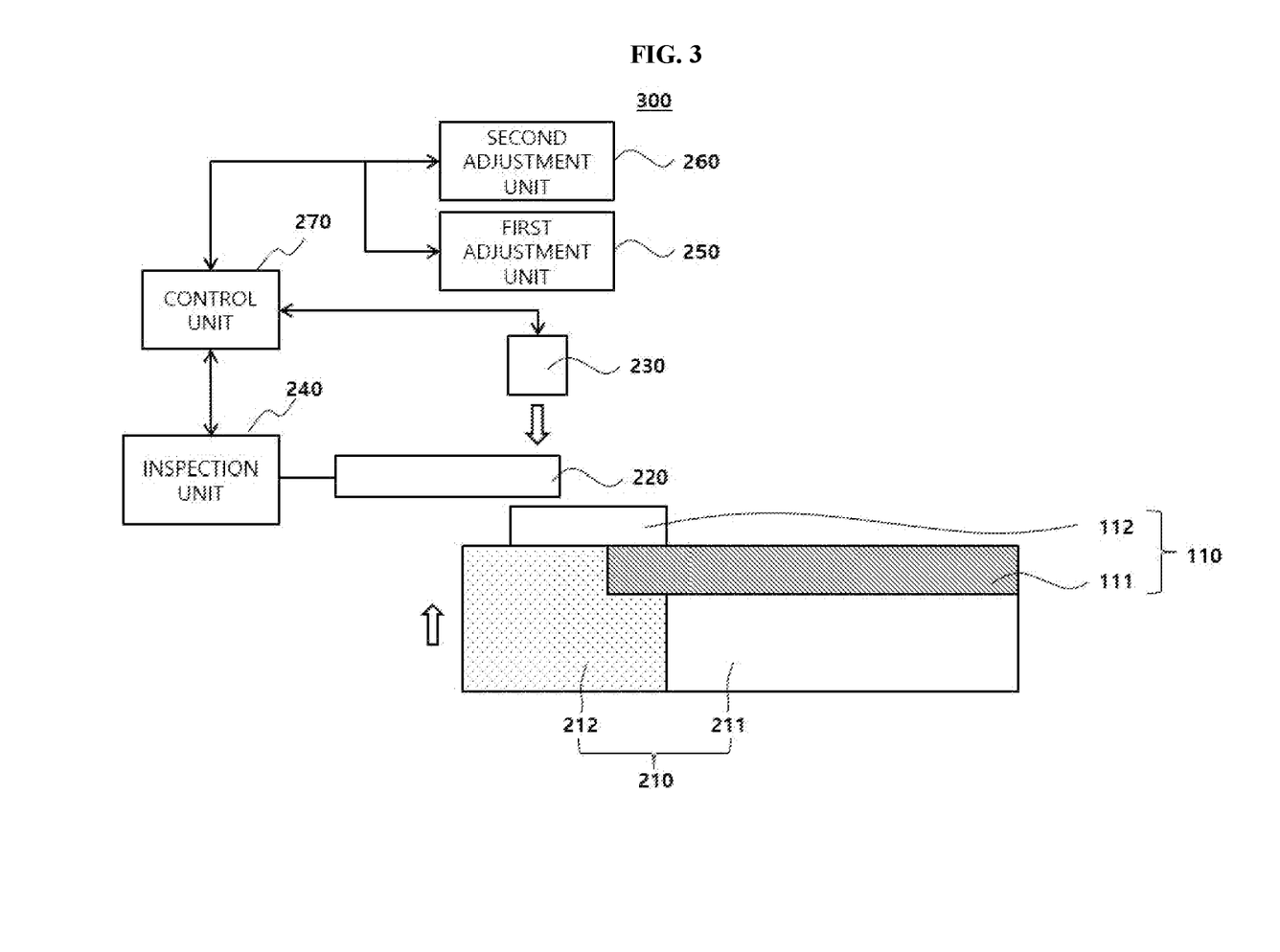
FIG. 3 schematically illustrates an apparatus for inspecting an antenna in accordance with an exemplary embodiment.

FIG. 3 schematically illustrates an apparatus for inspecting an antenna in accordance with an exemplary embodiment. Detailed description on elements and operations substantially the same as those described with reference to FIG. 2 are omitted herein.

Referring to FIG. 3, an antenna inspection apparatus 300 may include the stage 210, the inspection board 220, the connection maintaining unit 230, the inspection unit 240, a first adjustment unit 250, a second adjustment unit 260 and a control unit 270.

The first adjustment unit 250 may determine a alignment state between the antenna element 111 and the ground 211, and may adjust a position of the antenna element 111 or the ground 211 based on the determined alignment state. The first adjustment unit 250 may include a camera positioned above or below the ground 211 and an actuator that moves the antenna element 111 or the ground 211.

Properties of the antenna element 111 may be changed according to the position of the ground 211 or the alignment state between the antenna element 111 and the ground 211. Accordingly, according to an exemplary embodiment, the first adjustment unit 250 may precisely locate and align the ground 211 under the antenna element 111 to increase an accuracy of an antenna element inspection.

The second adjusting unit 260 may determine the alignment state and/or contact state of the inspection board 220 and the antenna board 112, and may adjust a position of the inspection board 220 or the antenna board 112 based on the determined alignment state and/or contact state. The second adjustment unit 260 may include a camera positioned above the inspection board 220 and an actuator that moves the inspection board 220 or the stage 210.

The transmission line of the inspection board 220 and the transmission line of the antenna board 112 may contact each other, so that the inspection board 220 and the antenna board 112 may be electrically connected. Accordingly, the accurate alignment and contact between the inspection board 220 and the antenna board 112 may be required.

In an embodiment, the second adjustment unit 260 may electrically connect the inspection board 220 and the antenna board 112 by accurately aligning and/or contacting the inspection board 220 and the antenna board 112. Accordingly, the accuracy of the antenna element inspection may be enhanced.

The control unit 270 may control an overall operation of the antenna inspection apparatus 300, and process signals related to the operation of the antenna inspection apparatus 300. In an embodiment, the control unit 270 may be implemented with one or more processor, one or more memory, or a combination thereof. The control unit 270 may be mounted on the inspection board 220 or may be mounted on an additional board connected to the inspection board 220.

Figure 4:
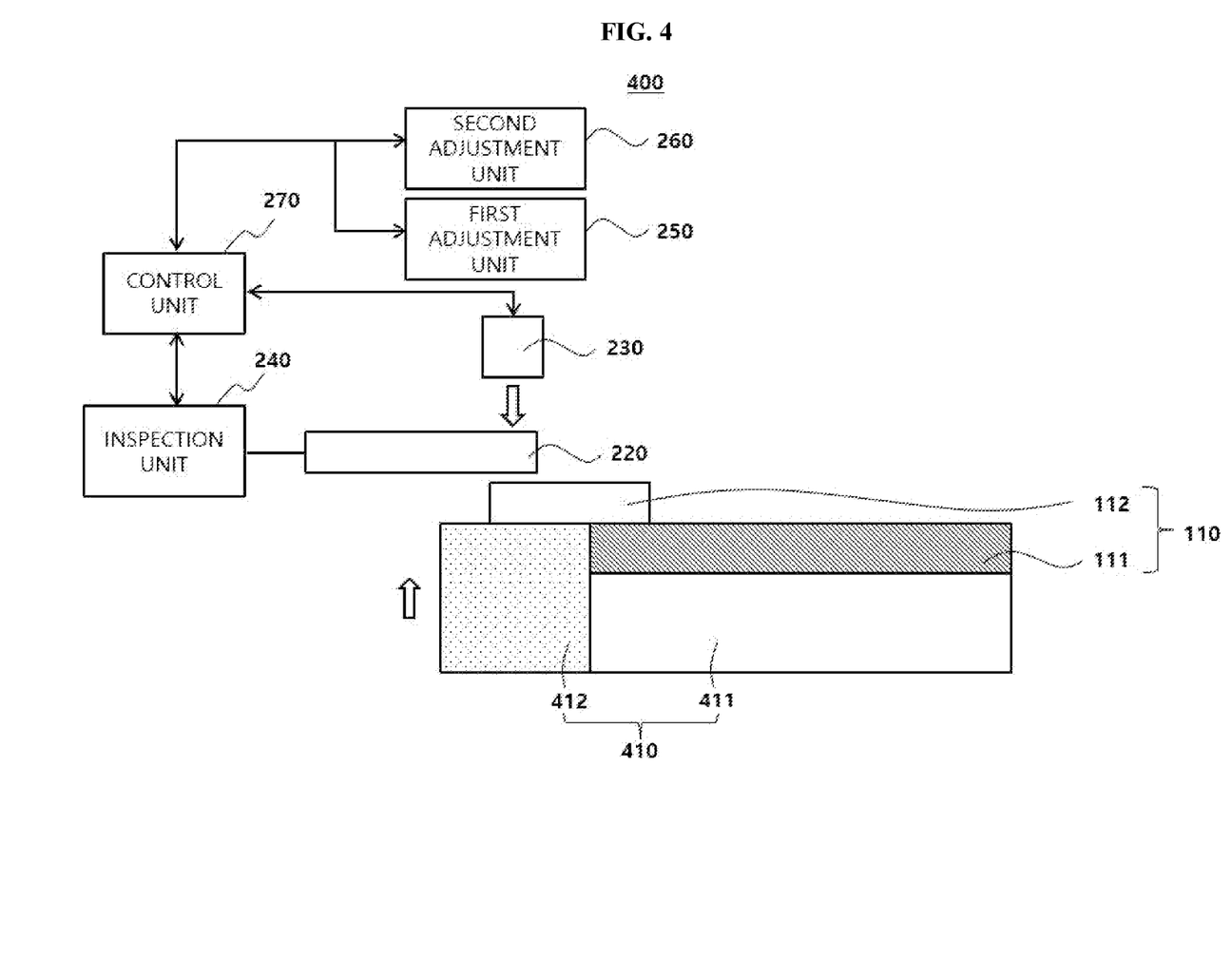
FIG. 4 schematically illustrates an apparatus for inspecting an antenna in accordance with an exemplary embodiment.

FIG. 4 schematically illustrates an apparatus for inspecting an antenna in accordance with an exemplary embodiment. Detailed descriptions of elements and operations substantially the same as or similar to those described with reference to FIGS. 2 and 3 are omitted herein.

Referring to FIG. 4, an antenna inspection apparatus 400 may include a stage 410, the inspection board 220, the connection maintaining unit 230, the inspection unit 240, the first adjusting unit 250, the second adjusting unit 260 and the control unit 270.

The antenna element 110 to be inspected may be disposed on the stage 410. The stage 410 may include a ground 411 and a board supporting portion 412.

The antenna element 111 may be disposed on the ground 411, and the antenna board 112 may be disposed on the board supporting portion 412. The board supporting portion 412 may supports the antenna board 112, and may have a flat upper surface without a stepped portion at an upper portion thereof.

Figure 5:
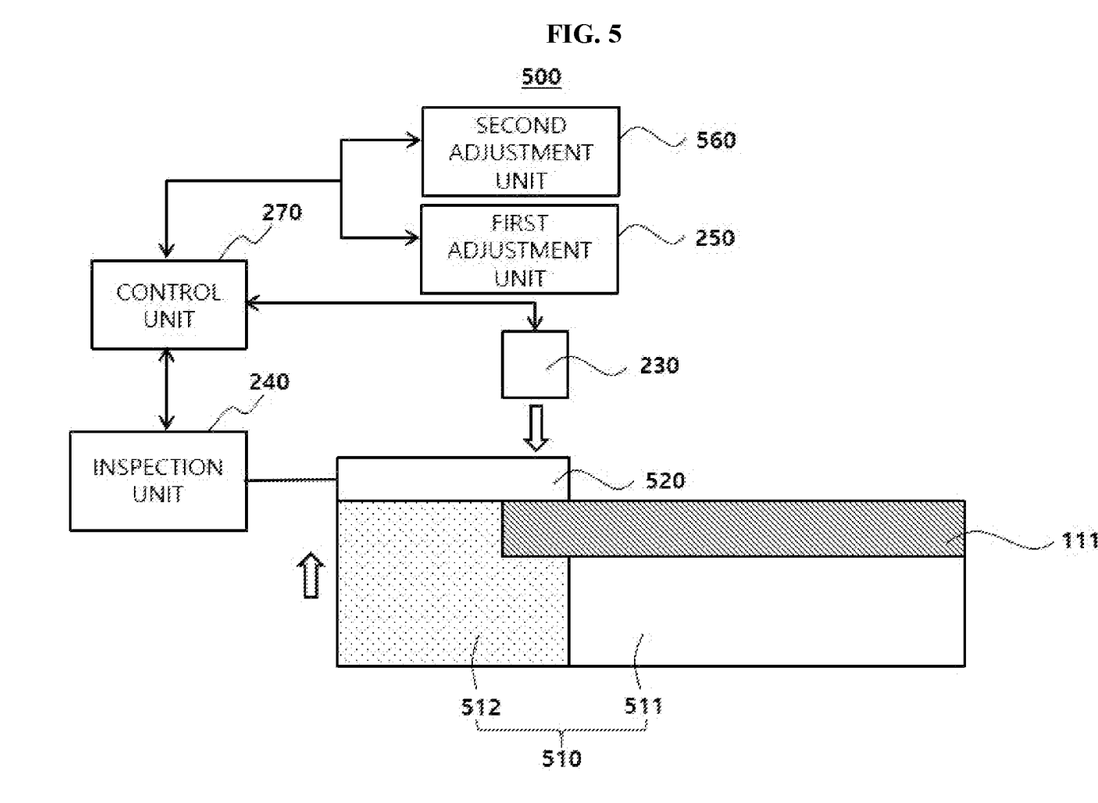
FIG. 5 schematically illustrates an apparatus for inspecting an antenna in accordance with an exemplary embodiment.

FIG. 5 schematically illustrates an apparatus for inspecting an antenna in accordance with an exemplary embodiment. Detailed descriptions of elements and operations substantially the same as or similar to those described with reference to FIGS. 2 to 4 are omitted herein.

Referring to FIG. 5, an antenna inspection apparatus 500 includes a stage 510, an inspection substrate 520, the connection maintaining unit 230, the inspection unit 240, the first adjusting unit 250, a second adjustment unit 560 and the control unit 270.

An antenna device including the antenna element 111 to be inspected may be disposed on the stage 510, and the antenna board 112 may be omitted.

The stage 510 may include a ground 511 and a board supporting portion 512.

A portion of the antenna element 111 may be disposed on the ground 511, and a remaining portion of the antenna element 111 and the inspection board 520 may be disposed on the board supporting portion 512. The board supporting portion 512 may support the inspection board 520.

As illustrated in FIG. 5, a stepped portion may be formed at an upper portion of the board supporting portion 512 such that a bonding portion of the antenna element 111 which the inspection board contacts and the inspection board 520 may be disposed.

The inspection board 520 may contact the antenna element 111 to be connected to the antenna element 111. The inspection board 520 may be in contact with the top surface of the antenna element 111, and a transmission line of the inspection board 520 may be electrically connected to an antenna pattern of the antenna element 111.

The second adjustment unit 560 may determine an alignment state and/or a contact state of the inspection board 520 and the antenna element 111, and positions of the inspection board 520 or the antenna element may be adjusted based on the determined alignment state and/or contact state. The second adjustment unit 560 may include a camera positioned above the inspection board 520 and an actuator that moves the inspection board 520 or the stage 510.

The transmission line of the inspection board 520 may contact the antenna pattern of the antenna element 111 to electrically connect the inspection board 520 and the antenna element 111. Accordingly, the accurate alignment and contact between the inspection board 520 and the antenna element 111 may be required.

In an embodiment, the second adjustment unit 560 may electrically connect the inspection board 520 and the antenna element 111 by accurately aligning and/or contacting the inspection board 520 and the antenna element 111. Accordingly, the accuracy of the antenna element inspection may be enhanced.

Figure 6:
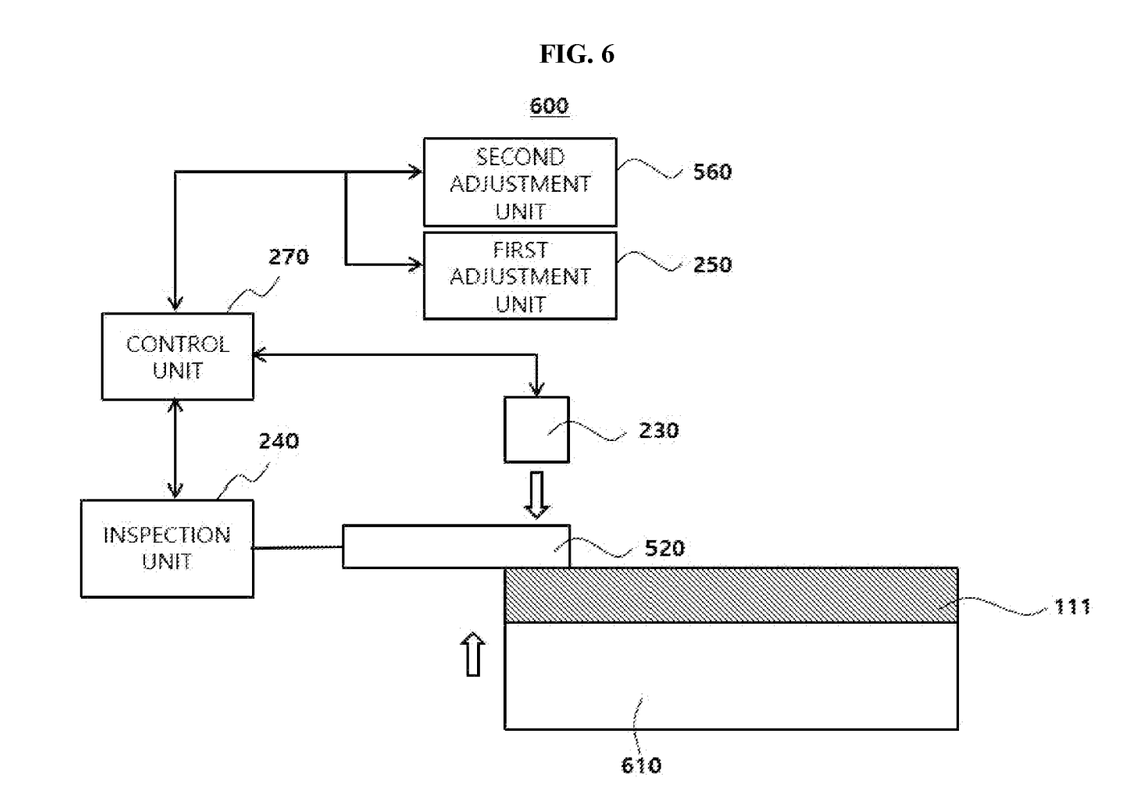
FIG. 6 schematically illustrates an apparatus for inspecting an antenna in accordance with an exemplary embodiment.

FIG. 6 schematically illustrates an apparatus for inspecting an antenna in accordance with an exemplary embodiment. Detailed descriptions of elements and operations substantially the same as or similar to those described with reference to FIGS. 2 to 5 are omitted herein.

Referring to FIG. 6, an antenna inspection apparatus 600 may include a stage 610, the inspection substrate 520, the connection maintaining unit 230, the inspection unit 240, the first adjustment unit 250, the second adjustment unit 560 and the control unit 270.

An antenna device including the antenna element 111 to be inspected may be disposed on the stage 610, and the antenna board 112 may be omitted.

The stage 610 may be formed of a metal, preferably a metal having a low resistance value (e.g., 1Ω), and may function as a ground.

Figure 7:
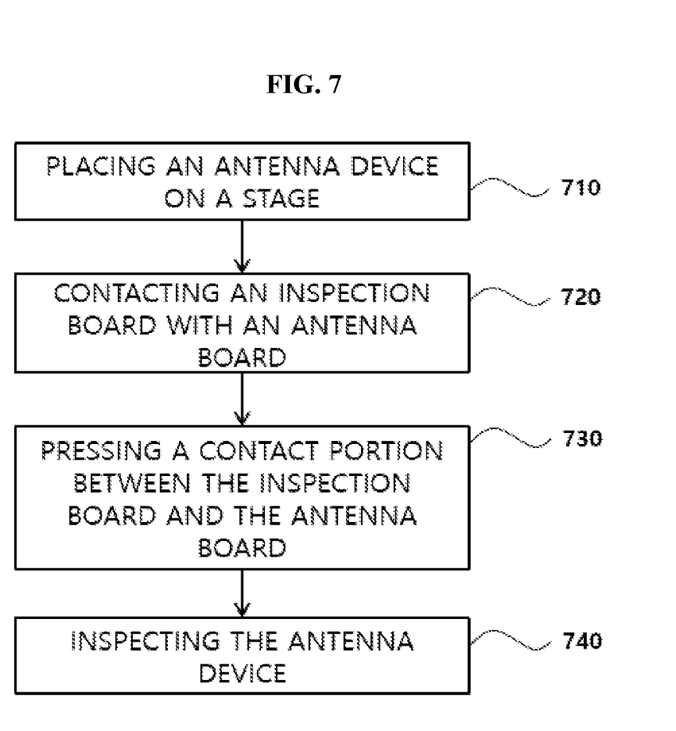
FIG. 7 is a flow diagram for describing a method for inspecting an antenna in accordance with exemplary embodiments.

FIG. 7 is a flow diagram for describing a method for inspecting an antenna in accordance with exemplary embodiments. The antenna inspection method of FIG. 7 may be performed by the antenna inspection apparatus 200 of FIG. 2.

Referring to FIG. 7, the antenna inspection apparatus may place the antenna device on the stage including the ground (e.g., in a step 710). The antenna device may include the antenna element and the antenna board connected to the antenna element.

The inspection board may be in contact with the top surface of the antenna board in the antenna device to electrically connect the inspection board and the antenna board (e.g., in a step 720).

The antenna inspection apparatus may maintain the connection between the antenna board and the inspection board by pressing a contact portion of the inspection board in contact with the top surface of the antenna board (e.g., in a step 730).

The antenna inspection apparatus may inspect the antenna apparatus (e.g., in a step 740). For example, the antenna inspection apparatus may measure an S parameter and a radiation efficiency of the antenna device, and may inspect whether bonding defects or an antenna pattern loss occurs based on the measured values.

Figure 8:
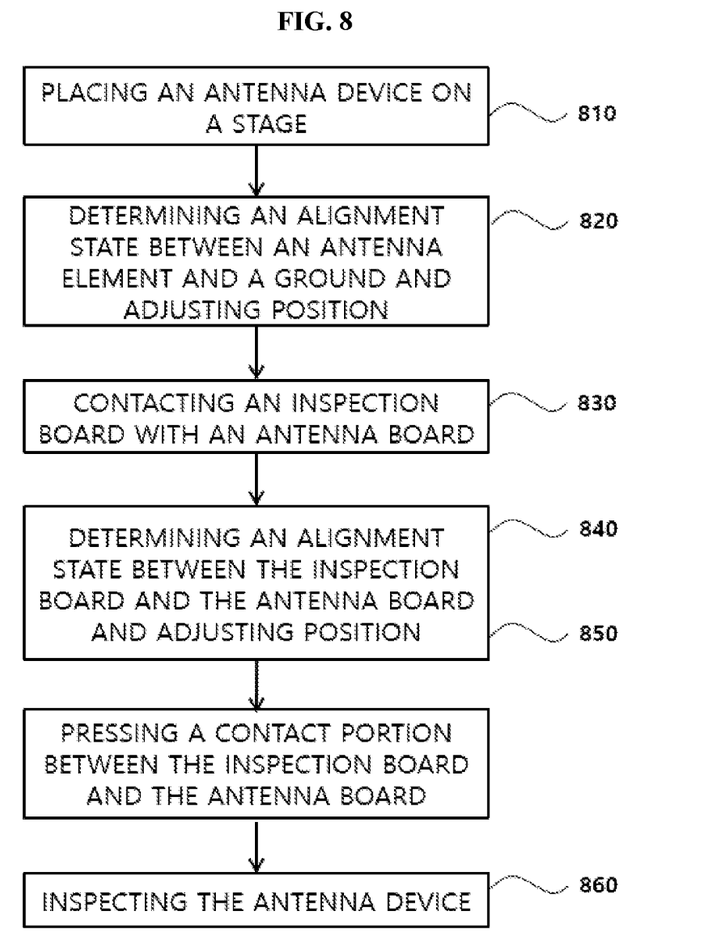
FIG. 8 is a flow diagram for describing a method for inspecting an antenna in accordance with an exemplary embodiment.

FIG. 8 is a flow diagram for describing a method for inspecting an antenna in accordance with an exemplary embodiment. The antenna inspection method of FIG. 8 may be performed by the antenna inspection apparatus 300 and 400 of FIGS. 3 and 4.

Referring to FIG. 8, the antenna inspection apparatus may place the antenna device on the stage including the ground (e.g., in a step 810). The antenna device may include the antenna element and the antenna board connected to the antenna element.

The antenna inspection apparatus may determine an alignment state of the antenna element and the ground, and may adjust a position of the antenna element or the ground based on the determined alignment state (e.g., in a step 820).

Properties of the antenna device may be changed according to the position of the ground, that is, the alignment state between the antenna element and the ground. The antenna inspection apparatus may increase the accuracy of the antenna apparatus inspection by finely positioning and aligning the ground under the antenna element.

The inspection board may be in contact with the top surface of the antenna board to electrically connect the inspection board and the antenna board (e.g., in a step 830).

The antenna inspection apparatus may determine the alignment state and/or contact state of the inspection board and the antenna board, and may adjust the position of the inspection board or the antenna board based on the determined alignment state and/or contact state (e.g., in a step 840).

The transmission line of the inspection board and the transmission line of the antenna board may be in contact with each other, so that the inspection board and the antenna board may be electrically connected. Thus, the accurate alignment and contact between the inspection board and the antenna board may be required. The antenna inspection apparatus may electrically connect the inspection board and the antenna board by finely aligning and/or contacting the inspection board and the antenna board. Accordingly, the accuracy of the antenna device inspection may be enhanced.

The antenna inspection apparatus may maintain the connection between the antenna board and the inspection board by pressing a contact portion of the inspection board in contact with the top surface of the antenna board (e.g., in a step 850).

The antenna inspection apparatus may inspect the antenna device (e.g., in a step 860). For example, the antenna inspection apparatus may measure an S parameter and a radiation efficiency of the antenna device, and may inspect whether a bonding defect or an antenna pattern loss occurs based on the measured values.

Figure 9:
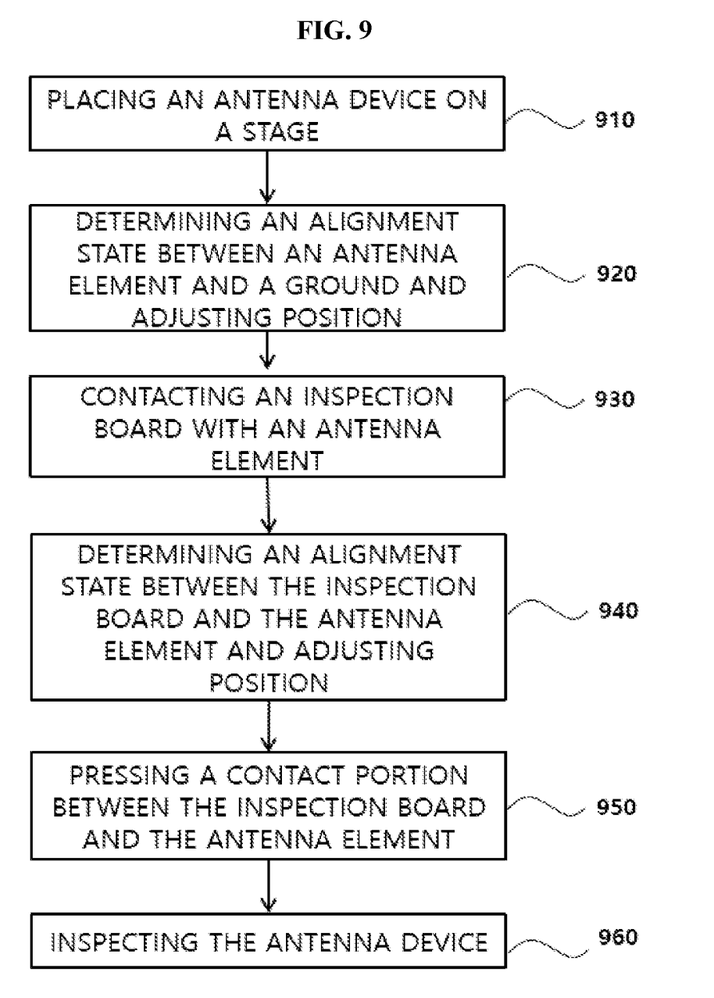
FIG. 9 is a flow diagram for describing a method for inspecting an antenna in accordance with an exemplary embodiment.

FIG. 9 is a flow diagram for describing a method for inspecting an antenna in accordance with an exemplary embodiment. The antenna inspection method of FIG. 9 may be performed by the antenna inspection apparatus 500 and 600 of FIGS. 5 and 6.

Referring to FIG. 9, the antenna inspection apparatus may place the antenna apparatus on the stage including the ground (e.g., in a step 910). The antenna device may include the antenna element.

The antenna inspection apparatus may determine the alignment state of the antenna element and the ground, and may adjust the position of the antenna element or the ground based on the determined alignment state (e.g., in a step 920).

Properties of the antenna device may be changed according to the position of the ground, that is, the alignment state between the antenna element and the ground. The antenna inspection apparatus may increase the accuracy of the antenna apparatus inspection by finely positioning and aligning the ground under the antenna element.

The inspection board may be in contact with the top surface of the antenna element to electrically connect the inspection board and the antenna element (e.g., in a step 930).

The antenna inspection apparatus may determine the alignment state and/or contact state of the inspection board and the antenna element, and may adjust the position of the inspection board or the antenna element based on the determined alignment state and/or contact state (e.g., in a step 940).

The transmission line of the inspection board may contact the antenna pattern of the antenna element, so that the inspection board and the antenna element may be electrically connected. Accordingly, precise alignment and contact between the inspection board and the antenna element may be required. The antenna inspection apparatus may electrically connect the inspection board and the antenna element by accurately aligning and/or contacting the inspection board and the antenna element. Accordingly, the accuracy of the antenna device inspection may be enhanced The antenna inspection apparatus may maintain the connection between the antenna element and the inspection board by pressing a contact portion of the inspection board in contact with the top surface of the antenna element (e.g., in a step 950).

The antenna inspection apparatus may inspect the antenna device (e.g., in a step 960). For example, the antenna inspection apparatus may measure an S parameter and a radiation efficiency of the antenna device, and may inspect whether a bonding defect or an antenna pattern loss occurs based on the measured values.

The above-described embodiments may be implemented as computer-readable codes on a computer-readable recording medium. The computer-readable recording medium may include any type of recording device in which data readable by a computer system is stored. Examples of the computer-readable recording medium may include ROM, RAM, CD-ROM, magnetic tape, floppy disk, optical disk, etc. The computer-readable recording medium may be distributed in network-connected computer systems, and may be written and executed as computer-readable codes in a distributed manner.

What is claimed is:

1. An apparatus for inspecting an antenna, the apparatus comprising:
   a stage on which an antenna device is disposed, the stage comprising a ground;
   an inspection board configured to be in contact with and connected to the antenna device;
   a connection maintaining unit for maintaining a contact and connection between the antenna device and the inspection board;
   an inspection unit mounted or connected to the inspection board to inspect the antenna device; and
   a first adjustment unit for determining an alignment state between the antenna device and the ground.

2. The apparatus for inspecting an antenna of claim 1, wherein the ground is formed of a metal having a resistance value of 3 Ω or less.

3. The apparatus for inspecting an antenna of claim 2, wherein the ground is formed of silver, gold, copper, aluminum or an alloy containing at least one therefrom.

4. The apparatus for inspecting an antenna of claim 1, wherein the inspection board comprises a flexible printed circuit board.

5. The apparatus for inspecting an antenna of claim 1, wherein the connection maintaining unit is configured to press a contact portion between the antenna device and the inspection board to maintain the contact and connection between the antenna device and the inspection board.

6. The apparatus for inspecting an antenna of claim 1, wherein the inspection unit is configured to measures an S parameter and a radiation efficiency of the antenna device.

7. The apparatus for inspecting an antenna of claim 1, wherein the first adjustment unit adjusts a position of the antenna device or the ground based on the determined alignment state.

8. The apparatus for inspecting an antenna of claim 1, wherein the stage further comprises a board supporting portion, and the board supporting portion is configured to support the antenna device or the inspection board.

9. The apparatus for inspecting an antenna of claim 8, wherein the board supporting portion is formed of Teflon or isopink.

10. An apparatus for inspecting an antenna, comprising:
a stage on which an antenna device is disposed, the stage comprising a ground;
an inspection board configured to be in contact with and connected to the antenna device;
a connection maintaining unit for maintaining a contact and connection between the antenna device and the inspection board;
an inspection unit mounted or connected to the inspection board to inspect the antenna device; and
a second adjustment unit for determining an alignment state or a contact state of the inspection board and the antenna device.

11. The apparatus for inspecting an antenna of claim 10, wherein the second adjustment unit adjusts a position of the inspection board or the antenna device based on the determined alignment state or the contact state.

12. A method for inspecting an antenna, the method comprising:
placing an antenna device on a stage comprising a ground;
determining an alignment state between the antenna device and the ground;
adjusting a position of the antenna device or the ground based on the determined alignment state;
contacting and connecting an inspection board with the antenna device;
pressing a contact portion between the inspection board and the antenna device; and
inspecting the antenna device.

13. The method of claim 12, further comprising:
determining an alignment state or a contact state between the inspection board and the antenna device; and
adjusting a position of the inspection board or the antenna device based on the determined alignment state or the contact state.

* * * * *